(12) United States Patent
Chang et al.

(10) Patent No.: US 9,324,437 B2
(45) Date of Patent: Apr. 26, 2016

(54) SYSTEMS AND METHODS FOR TRIMMING CONTROL TRANSISTORS FOR 3D NAND FLASH

(71) Applicant: MACRONIX INTERNATIONAL CO., LTD., Hsinchu (TW)

(72) Inventors: Kuo Pin Chang, Miaoli County (TW); Chih-Shen Chang, Taipei (TW); Hang-Ting Lue, Hsinchu (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 37 days.

(21) Appl. No.: 14/446,866

(22) Filed: Jul. 30, 2014

(65) Prior Publication Data

US 2016/0035424 A1 Feb. 4, 2016

(51) Int. Cl.
*G11C 16/10* (2006.01)
*G11C 16/04* (2006.01)

(52) U.S. Cl.
CPC ............ *G11C 16/10* (2013.01); *G11C 16/0466* (2013.01); *G11C 16/0483* (2013.01)

(58) Field of Classification Search
CPC ............................... G11C 16/10; G11C 16/046
USPC .......................................................... 365/17
See application file for complete search history.

(56) References Cited

U.S. PATENT DOCUMENTS

| | | | |
|---|---|---|---|
| 7,941,592 B2 | 5/2011 | Bonella et al. | |
| 8,243,518 B2 * | 8/2012 | Oh | G11C 16/0483 365/185.18 |
| 8,570,808 B2 | 10/2013 | Park et al. | |
| 8,576,629 B2 * | 11/2013 | Choe | G11C 16/0483 365/185.14 |
| 2011/0063916 A1 | 3/2011 | Maeda | |
| 2011/0194366 A1 | 8/2011 | Kwon | |
| 2011/0286283 A1 | 11/2011 | Lung et al. | |
| 2012/0248595 A1 | 10/2012 | Or-Bach et al. | |
| 2013/0088921 A1 * | 4/2013 | Nam | G11C 16/0483 365/185.17 |
| 2013/0114345 A1 * | 5/2013 | Lee | G11C 16/0483 365/185.22 |
| 2013/0219108 A1 | 8/2013 | Yang | |
| 2013/0336065 A1 | 12/2013 | Morooka et al. | |
| 2014/0198570 A1 * | 7/2014 | Hsieh | G11C 16/10 365/185.03 |

FOREIGN PATENT DOCUMENTS

TW 201142852 12/2011
TW 201351421 12/2013

OTHER PUBLICATIONS

Official Action from Taiwanese Patent Application No. 103133158 dated Dec. 29, 2015.

* cited by examiner

*Primary Examiner* — Hoai V Ho
*Assistant Examiner* — Tri Hoang
(74) *Attorney, Agent, or Firm* — Baker & McKenzie LLP (57) ABSTRACT

Control transistors and memory cells within 3D NAND Flash memory arrays may both be created using the same technology, such as charge trapping structures, to simplify the fabrication process. However, the resulting control transistors may initially have higher variability in threshold voltages, when compared to traditional gate-oxide-based control transistors. Provided are exemplary techniques to trim control transistors to provide increased reliability and performance during array operation.

20 Claims, 9 Drawing Sheets

SYSTEMS AND METHODS FOR TRIMMING CONTROL TRANSISTORS FOR 3D NAND FLASH

RELATED APPLICATIONS

The present application is related to U.S. patent application Ser. No. 13/078,311 entitled "Memory Architecture of 3D Array with Alternating Memory String Orientation and String Select Structures," filed Apr. 1, 2011 and issued as U.S. Pat. No. 8,503,213 on Aug. 5, 2013, the contents of which are incorporated herein by reference.

BACKGROUND

1. Technical Field

The present application generally relates to three-dimensional NAND Flash memory and, more specifically, to systems and methods of adjusting the threshold voltages of control transistors for better performance during operation of a memory array.

2. Related Art

NAND Flash memory is a nonvolatile memory that is used in a wide range of applications including mobile phones, digital cameras, and solid-state hard drives. The high storage density of NAND Flash memory, especially when compared to NOR Flash memory, has played a large role in its market penetration. This storage density is achieved in part through the use of strings of memory cells connected in series between a ground line and bit lines, which reduces the number of metal contacts required. These strings are commonly called "NAND strings" due to their resemblance to NAND gates. Each memory cell within a NAND string can be addressed by a word line that the memory cell shares with neighboring cells of other NAND strings. In the past, NAND Flash memory has been implemented as a two-dimensional (planar) array defined by word lines and bit lines that intersect perpendicularly, with the memory cells being formed at those intersections.

The NAND string topology has been further developed to achieve still greater storage density. Such efforts have lead to the development of three-dimensional (3D) NAND Flash memory, in which memory cells are stacked vertically on top of one another.

Figure 1:
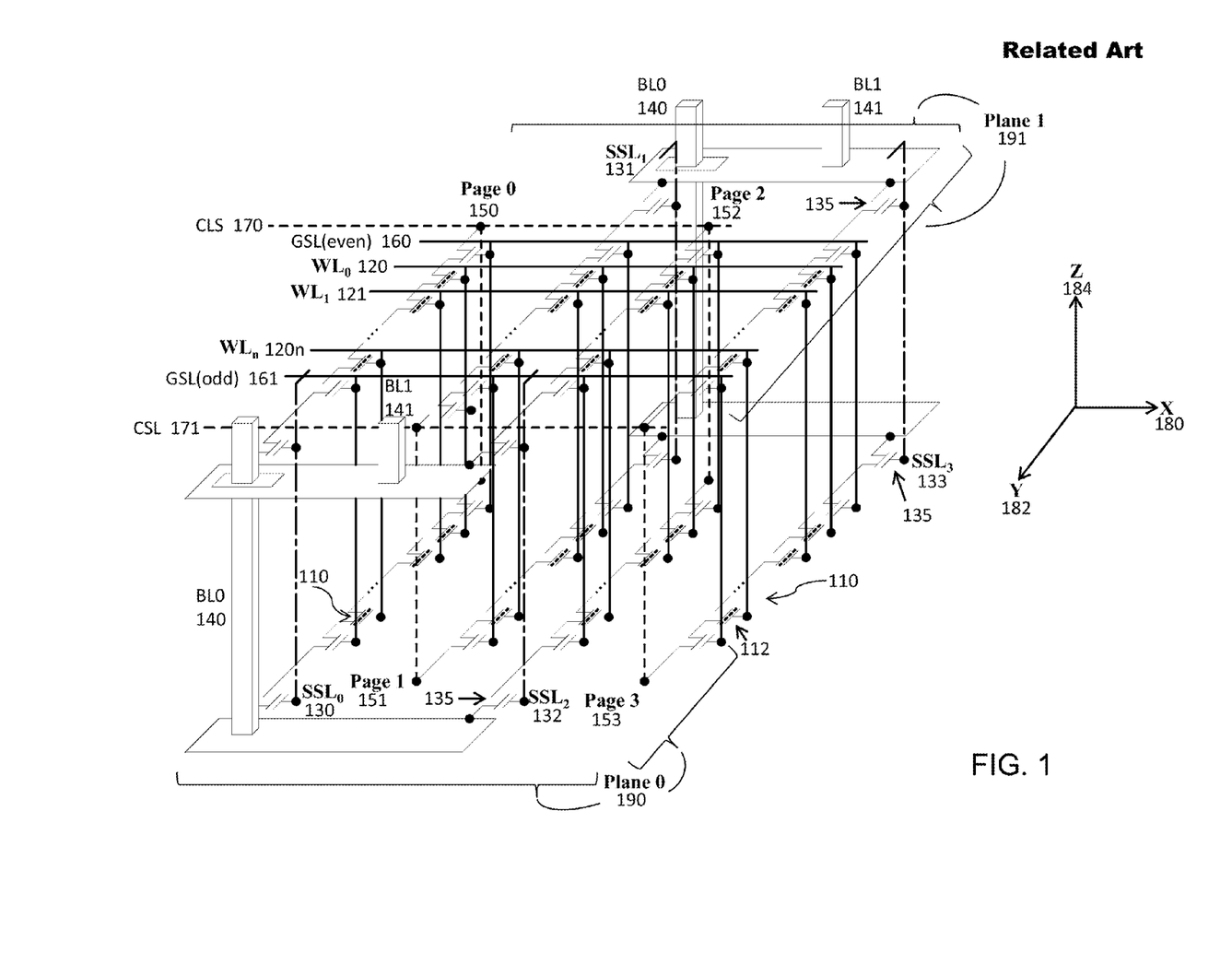
FIG. 1 shows a schematic view illustrating a 3D NAND Flash array.

FIG. 1 shows a schematic diagram illustrating a 3D NAND Flash array, as well as various transistors used for control. This figure shows four pages 150, 151, 152, 153 (Page 0 to Page 3), which contain a total of eight NAND strings 110. Each NAND string 110 includes a plurality of memory cells, such as the memory cell 112. Each memory cell can be addressed using at least one of the bit lines 140, 141 ($BL_0$ and $BL_1$), at least one of the string select lines 130, 131, 132, 133 ($SSL_0$ to $SSL_3$), and at least one of the word lines 120, 121, 120n ($WL_0$ to $WL_n$). The bit lines 140, 141 may connect to the memory planes 190, 191, which are different depths of the array structure, such that the memory planes associated with different bit lines may be stacked on top of one another in a z-direction 184. In the embodiment shown in FIG. 1, the bit line 140 ($BL_0$) accesses the plane 190 (Plane 0) and the bit line 141 ($BL_1$) accesses the plane 191 (Plane 1), which is above the plane 190. Furthermore, the bit lines 140, 141 may each be provided at opposite sides of the array structure.

String select lines 130, 131, 132, 133 may be connected to string select transistors 135, which are formed in string select structures on opposite sides of the array structure. These string select transistors connect the array structure to on-chip sense circuitry (not shown) attached to each bit line 140, 141.

Each page may be associated with a unique string select line. As shown in the figure, the page 150 (Page 0) is accessible by the string select line 130, the page 151 (Page 1) is accessible by the string select line 131, the page 152 (Page 2) is accessible by the string select line 132, and the page 153 (Page 3) is accessible by the string select line 133. This allows an SSL signal travelling on a given string select line to select a given page (e.g., a stack) of memory cells, effectively setting an "x" coordinate in an x-direction 180. It should be further noted that each page may comprise multiple NAND strings 110, and each NAND string 110 may have an associated string select transistor 135.

The string select transistors 135 connected to even pages 150, 152 may form a first string select structure on one side of the array, and the string select transistors 135 connected to odd pages 151, 153 may form a second string select structure on the opposite side of the array.

The word lines 120, 121, 120n may be connected to gates of the memory cells. Accordingly, a WL signal may address a given memory cell within a selected NAND string, thereby setting a "y" coordinate in a y-direction 182.

Accordingly, each cell within the 3D NAND Flash array may effectively be addressable through "x," "y," and "z" coordinates. More specifically, the cells are addressable through signals on the control lines, and they may be addressed for read, program, and erase operations thereby. For example, the memory cell 112 may be addressed by sending and/or receiving signals on the string select line 133, the word line 120n, and the bit line 140. Control signals on unselected lines may additionally be required to perform a given operation.

The ground select lines 160, 161 (GSL(even) and GSL(odd)) and common source lines 170, 171 (CSL) may provide additional controllability, as described below with respect to FIG. 2. Referring back to FIG. 1, in some embodiments, the common source lines 170 and 171 are connected together.

It should be noted that the orientations of the strings in adjacent pages alternate between bit-line-end-to-source-line-end and source-line-end-to-bit-line-end, which results in the positions of the string select structure (which connects the array to the bit lines) and the common source line physically alternating between even pages and odd pages. For example, on even pages 150, 152, the word line 120 ($WL_0$) is the nearest word line to the common source line 170. However, on odd pages 151, 153, the same word line 120 is the farthest from the common source line 171. Related U.S. Pat. No. 8,503,213 provides further detail into this topology, as well as the reasoning behind it, and is incorporated herein by reference for these and all other purposes.

As indicated in FIG. 1, the number of word lines may vary based on design considerations. While FIG. 1 shows four pages and two bit lines, the number of pages and bit lines may also vary based on design considerations.

Figure 2:
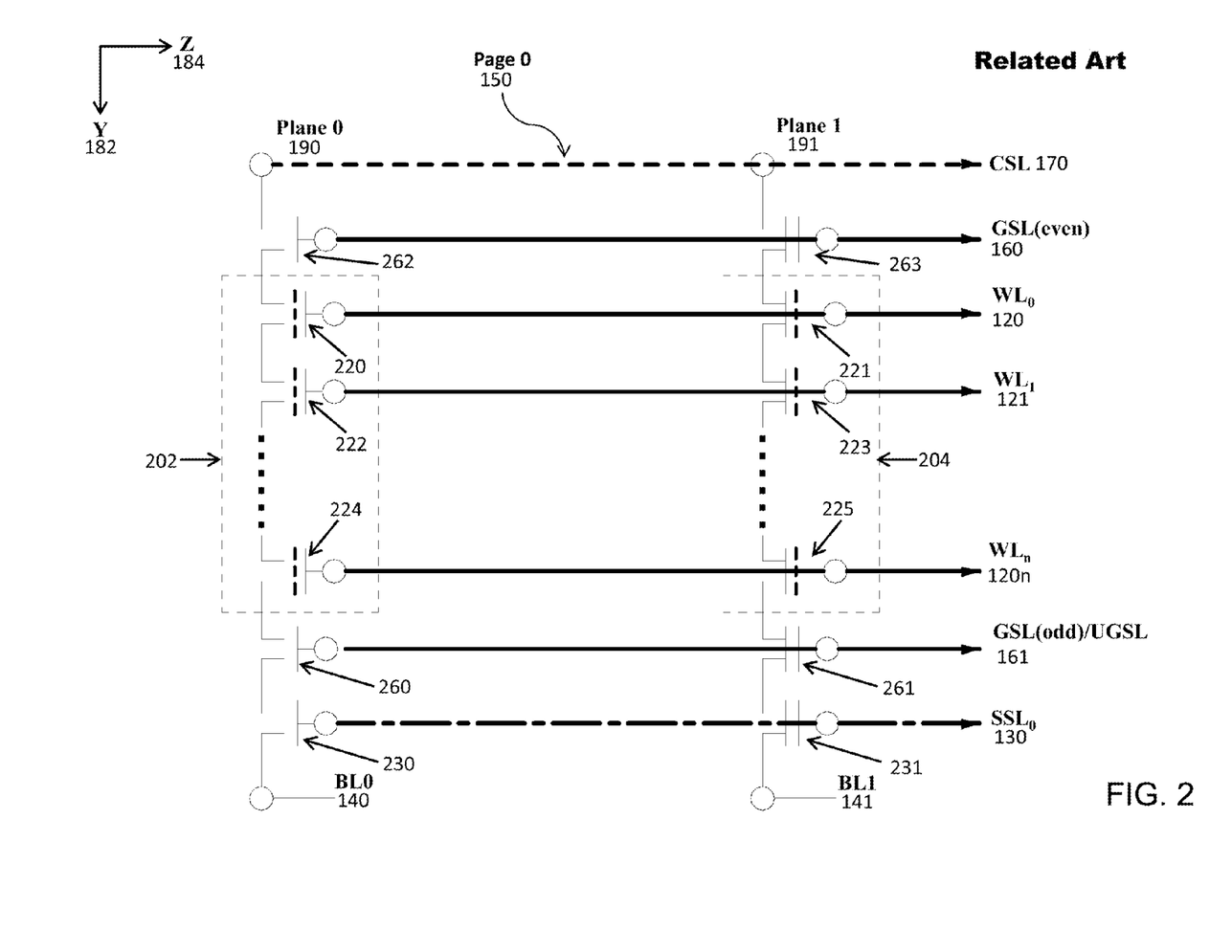
FIG. 2 shows a schematic view illustrating two NAND strings within an even page of a 3D NAND Flash array.

FIG. 2 shows a schematic diagram illustrating two strings in an even page of the array structure shown in FIG. 1. Certain reference numerals are reused to represent similar structures and will not be described again. The NAND string 202 extends in the y-direction 182 and is connected to the bit line 140 ($BL_0$). The NAND string 204 also extends in the y-direction 182 and is offset from the NAND string 202 in the z-direction 184 (e.g., on top of the NAND string 202). Accordingly, the NAND string 204 is in a different plane and is connected to the bit line 141 ($BL_1$), which is associated with that plane. The NAND string 202 comprises the memory cells 220, 222, and 224, and the NAND string 204 comprises the memory cells 221, 223, and 225. These memory cells store information such as digital values (e.g., bits), whereas the other transistors function to control the array structure. As indicated in FIG. 2, the length (e.g., the number of memory cells) in the NAND strings 202 and 204 can vary.

The word line 120 is connected to the gates of the memory cells 220 and 221, the word line 121 is connected to the gates of the memory cells 222 and 223, and the word line 120$n$ is connected to the gates of memory cells 224 and 225. The gates may be floating gates or other charge trapping structures that have alterable threshold voltages ($V_t$). The word lines 120, 121, and 120$n$ may be used to apply the voltages necessary to perform read, program, and erase operations. Further, the NAND strings 202 and 204 may be selected by the string select transistors 230 and 231, respectively, whose gates both receive signals on the string select line 130. As described above, the string select transistors 230 and 231 can connect and disconnect the NAND strings 202 and 204, respectively, from the bit lines 140 and 141, respectively. The ground select transistor 262 can connect and disconnect the NAND string 202 from the common source line 170, based on the signal received on the even ground select line 160. Similarly, the ground select transistor 263 can connect and disconnect the NAND string 204 from the common source line 170 using the same signal.

The NAND strings 202 and 204 may further depend on the upper ground select transistor 260 and 261, respectively, whose gates both receive signals on the upper ground select line (UGSL) 161. During fabrication, the upper ground select transistors 260 and 261 may result as a side effect of creating ground select transistors on odd pages (e.g., in a split-gate 3D NAND Flash architecture). Accordingly, the upper ground select line 161 may also be referred to as the odd ground select line 161. The upper ground select transistors 260 and 261 do not necessarily provide additional granularity of control for the even NAND strings 202 and 204 beyond what is provided by the string select transistors 230 and 231. Much like the string select transistors 230 and 231, the upper ground select transistors 260 and 261 can connect and disconnect the NAND strings 202 and 204, respectively, from the bit lines 140 and 141, respectively. Accordingly, the upper ground select transistors 260 and 261 may be removed, but the fabrication process may be greatly simplified through their inclusion.

Though not shown in this figure, NAND strings on odd pages may have a similar layout, with a reversed orientation in the y-direction 182. As a result, the positions of the bit lines and the common source lines may be switched. Furthermore, the odd ground select line 161 may be connected to ground select transistors of the odd NAND strings, and the even ground select line 160 may be connected to upper ground select transistors of the odd NAND strings. Also, as the odd NAND strings are on different pages, different string select lines and transistors may be used. The same word lines 120, 121, 120$n$ may be connected to both even and odd NAND strings, though their relative proximity to the corresponding string select structure may be reversed.

The following is a description of a read operation, which illustrates the usage and importance of the control transistors (e.g., string select transistors, ground select transistors, and upper ground select transistors). If the memory cell 220 is to be read, signals on the string select line 130 and the upper ground select line 161 should exceed the $V_t$ of the string select transistor 230 and the $V_t$ of the upper ground select transistor 260, respectively. This allows the bit line 140 to be connected to the NAND string 202, which includes the selected memory cell 220. Furthermore, a signal on the ground select line 160 should exceed the $V_t$ of the ground select transistor 262, so that the NAND string 202 is connected to the common source line 170. A read voltage may be placed on the word line 120 ($WL_0$) corresponding to the selected memory cell 220, and a pass voltage may be placed on the other word lines 121 to 120$n$ ($WL_1$ to $WL_n$). The read voltage may be selected to cause the memory cell 220 to conduct only if its $V_t$ is below a certain level (e.g., 0 V). Conversely, the pass voltage can be chosen to cause all unselected memory cells on the NAND string 202 (e.g., the memory cells 222 and 224) to conduct independent of their respective threshold voltages. Under these conditions, the state of the memory cell 220, such as whether its $V_t$ is above or below 0 V, may be determined by sense circuitry (not shown) connected to the bit line 140 using charge integration or other methods known in the art. This state can translate into a digital value (e.g., a bit). In the case of multi-level cell (MLC) NAND Flash, which is used in some embodiments, each memory cell can hold more than one bit. This can result in greater storage density, but it requires more precision, both when programming $V_t$ values into each memory cell and when measuring these programmed $V_t$ values.

It should be noted that the bit line 140 may also be connected to other NAND strings. When a read operation is performed on another NAND string connected to the bit line 140, the string select transistor 230 may be switched off to prevent leakage onto the bit line 140 caused by the NAND string 202, as any such leakage would negatively affect the read operation. Therefore, the $V_t$ of the string select transistor 230 should not be exceeded during read operations of other NAND strings connected to the bit line 140.

As discussed above, if the control transistors are not properly configured, a variety of problems can arise. In general, an excessively low $V_t$ can lead to slower programming speed, poor programming inhibition, and high leakage from unselected lines. Conversely, an excessively high $V_t$ can lead to read fails, as desired memory cells may not be fully selectable. In some scenarios, uncontrolled threshold voltages may even lead to unintentional leakage between a common source line and a bit line, leading to degradation of the voltages on either or both lines. The string select transistors, the ground select transistors, and the upper ground select transistors directly impact the performance of read, program, and erase operations. The $V_t$ distributions of these transistors should therefore be well controlled.

As briefly mentioned above, various challenges affect the fabrication of 3D NAND Flash arrays. For example, placing multiple memory cells on top of one another often requires trenches and vias with high aspect ratios. If the memory cells utilize charge trapping technology such as silicon-oxide-nitride-oxide-silicon (SONOS), it can be difficult to remove the oxide-nitride-oxide (ONO) layers from the non-memory transistors (e.g., control transistors) due to these high aspect ratios. This makes the formation of traditional gate oxides difficult. Accordingly, the control transistors may be designed using the same technology as the memory cells, e.g., having ONO layers, to simplify the fabrication process. As a result, the control transistors may include charge trapping structures similar to those of the memory cells, though the relative dimensions may vary.

While modifying the control transistors can decrease process complexity, it can also introduce new challenges. For example, gate-oxide-based control transistors can be designed to have intrinsically narrow $V_t$ distributions (e.g., minor variability over the entire array), but this can be much more difficult for ONO-based control transistors. It is therefore highly desirable to tighten the $V_t$ distributions of the control transistors to improve reliability and performance, while also increasing the associated process window.

SUMMARY

Described herein are methods for trimming control transistors for a memory array and systems for controlling the memory array using the trimmed control transistors. The memory array may have first and second strings of memory cells, and the control transistors may include first and second string select transistors, first and second upper ground select transistors, and first and second ground select transistors, each corresponding to one of the first and second strings of memory cells. The first and second strings of memory cells may be connected to a common bit line via the first and second string select transistors, respectively.

In some embodiments, the control transistors may include charge trapping structures. These charge trapping structures may comprise an oxide-nitride-oxide layer that is similar to that of the memory cells.

A controller may be used to trim each of the control transistors, wherein the trimming process may involve changing the control transistors' threshold voltages. The trimming process may comprise three actions.

The first action may involve trimming the string select transistors. During this action, each string select transistor may be selected for trimming, and programming may be inhibited on unselected select transistors sharing a page with the selected string select transistor. In some embodiments, this program inhibition may occur through a raised bit line method, wherein the channels of the unselected string select transistors are raised to higher voltages than the channels of the selected string select transistors. This leads to a smaller voltage differential on the unselected transistors inhibits programming of these transistors at this time. In some embodiments, the trimming may involve using incremental step pulse programming.

The second action may involve trimming the upper ground select transistors. During this action, each upper ground select transistor may be selected for trimming, and programming may be inhibited on the unselected upper ground select transistors. In some embodiments, this program inhibition may involve a self-boosting method, wherein the unselected transistors are disconnected from the bit line and their channels are boosted through capacitive coupling. This may allow each upper ground select transistor to be selectively trimmed. In some embodiments, the trimming may involve using incremental step pulse programming.

The third action may involve trimming the ground select transistors. In some embodiments, the first and second ground select transistors corresponding to the first and second strings of memory cells sharing a bit line are trimmed substantially simultaneously using an open-loop programming technique.

BRIEF DESCRIPTION OF THE DRAWINGS

Features, aspects, and embodiments of the disclosure are described in conjunction with the attached drawings, in which.

These exemplary figures and embodiments, along with the exemplary figures that are included in the body of this patent application, are to provide a written, detailed description of the subject matter set forth by any claims that issue from the present application. These exemplary figures and embodiments should not be used to limit any claims that ultimately issue in a patent from the present application.

Further, although similar reference numbers may be used to refer to similar structures for convenience, it can be appreciated that each of the various example embodiments may be considered to be distinct variations.

DETAILED DESCRIPTION

Figure 3:
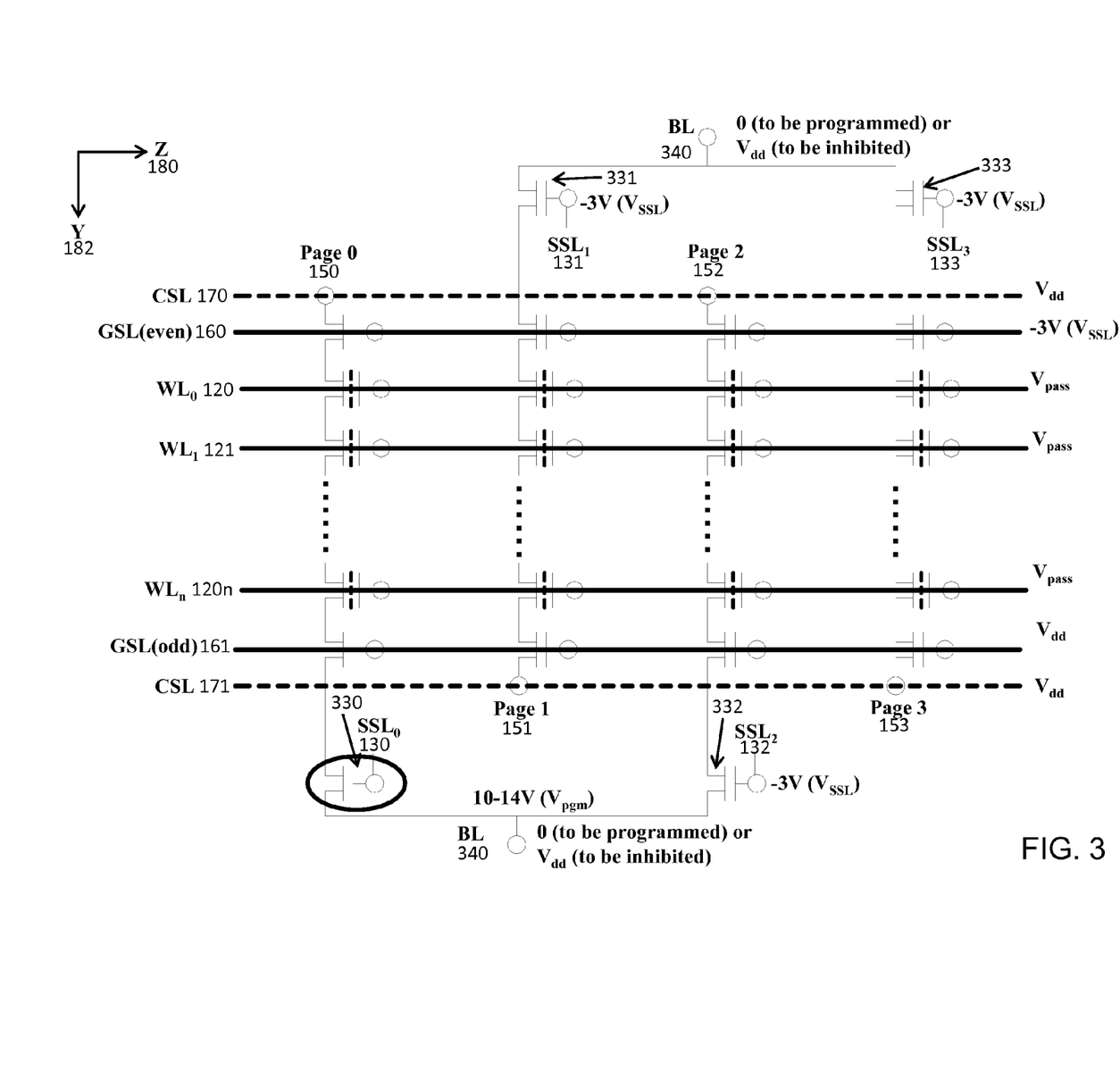
FIG. 3 shows a schematic view illustrating a string select transistor trimming action.

FIG. 3 shows a schematic view illustrating a string select transistor trimming action. The term "trimming" broadly refers to adjusting the $V_t$ of one or more selected transistors. This trimming action is illustrated as being applied to a plane in the array structure shown in FIG. 1. Certain reference numerals are reused in FIGS. 3, 4, and 5 to represent structures similar to those previously presented and will not be described again.

During array operation, the string select transistors 330, 331, 332, 333 may each select a NAND string to be connected to a bit line 340. Generally, only one string is connected to the bit line 340 at a given time. It is therefore highly beneficial for the string select transistors 330, 331, 332, 333 to be predictably and reliably controllable. Accordingly, during the string select transistor trimming action, these transistors may each be trimmed individually. FIG. 3 specifically demonstrates the trimming of the string select transistor 330 in the page 150. Because the bit line 340 is associated with the transistor 330 to be trimmed, it may be set to 0V. All other bit lines in the array may be set at a power supply voltage, $V_{dd}$, which may be greater than 0V to inhibit programming the unselected string select transistors (not shown) sharing the string select line 130 and the page 150. This is known as the raised bit line method, which inhibits the string select line without requiring self-boosting of the channels (discussed below, with respect to FIG. 5). $V_{dd}$ may be set to 2.5 V, 3 V, 3.3 V, or any other suitable voltage level depending on the requirements of a given application.

As further shown in FIG. 3, when the string select transistor 330 is in the process of being trimmed, the other string select transistors 331, 332, 333 in the plane may be set to a different voltage, $V_{SSL}$, so that these transistors are not programmed at this time. In some embodiments, $V_{SSL}$ is -3V. Accordingly, the string select transistor 330 has a greater voltage differential between its channel and gate than the unselected transistors. This greater voltage differential may be large enough to affect the charge stored within the gate, which allows the $V_t$ of string select transistor 330 to be trimmed. The smaller voltage differential on the unselected transistors inhibits programming of these transistors at this time.

As the selected NAND string is even, the even ground select line 160 may be set to a voltage below the $V_t$ of the untrimmed even ground select transistors. This can be accomplished by using the same voltage signal that is sent to turn off the unselected string select transistors, $V_{SSL}$. Reusing the $V_{SSL}$ voltage is beneficial, though not required, as it reduces the total number of power rails and signals. By applying $V_{SSL}$ or a similar voltage to the even ground select line 160, the common source line 170 is disconnected from the selected NAND string, so that it does not affect the voltage in the channel of the string select transistor 330.

The common source lines 170, 171 and the odd ground select line 161 may be set to $V_{dd}$, and all of the word lines 120, 121, 120n may be set to a pass voltage, $V_{pass}$. These voltages may be selected to be similar or identical to the voltages used for programming memory cells within the array, thereby reducing the total number of power rails and signals as well as system complexity in general. However, other voltages may be used for the common source lines 170, 171, the odd ground select line 161, and the word lines 120, 121, 120n.

The trimming process adjusts the $V_t$ of the string select transistor 330 using a closed loop programming technique. Feedback can be established using sense circuitry (not shown) connected to the bit line 340. This sense circuitry can be the same sense circuitry typically associated with a page buffer during standard array operation (e.g., program verification of memory cells). With the aid of this feedback, the string select transistor 330 can be programmed using incremental step pulse programming (ISPP), or any other closed loop technique. The programming technique may be the same or different from the programming technique subsequently performed on memory cells within the array. In some embodiments, by utilizing the same programming technique for both the control transistors and the memory cells, the control circuitry may be shared, leading to a reduction in both die area and layout complexity. In some embodiments, the programming voltage, $V_{pgm}$, is between 10V and 14V.

The string select transistors on a plurality of pages (e.g., every page) may be trimmed during the string select transistor trimming action. In some embodiments, a plurality of string select transistors on a selected page (e.g., those on different layers but vertically aligned) may be trimmed sequentially. Here, when a string select transistor on a selected layer and page is trimmed, the raised bit line method may be used to inhibit programming of other string select transistors on the selected page but on unselected layers (e.g., above and below the selected transistor). Each layer may be iterated through until each of the string select transistors on the selected page are trimmed. In other embodiments, the string select transistors on a selected page may be trimmed in parallel with one another.

After each of the string select transistors in a page is trimmed, the process may be repeated for the next page. A similar technique may be used for the odd pages. When programming odd pages, the odd ground select line may be set to $V_{SSL}$ and the even ground select line may be set to $V_{dd}$. In some embodiments, the string select transistor trimming action is alternately applied to even and odd pages. In another embodiment, the action is applied to a set of even pages before being applied to a set of odd pages. In yet another embodiment, the action is applied to a set of odd pages before being applied to a set of even pages. Other ordering schemes for applying the action to multiple even and odd pages are contemplated.

Figure 4:
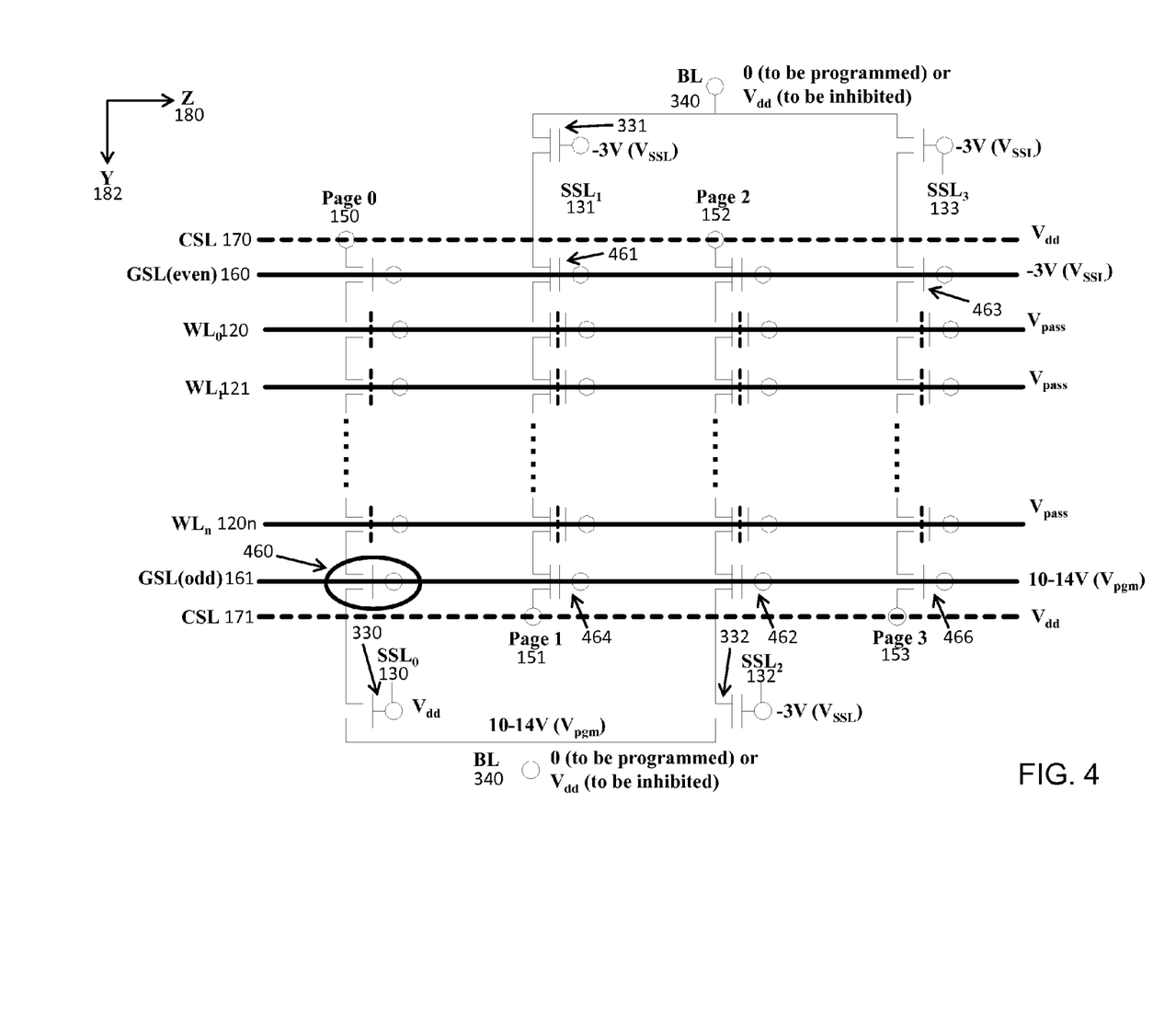
FIG. 4 shows a schematic view illustrating an upper ground select transistor trimming action.

FIG. 4 shows a schematic view illustrating an upper ground select transistor trimming action. As shown in the figure, this action may be applied to the plane shown in FIG. 3, and it may follow the string select transistor trimming action.

FIG. 4 specifically shows the trimming of the upper ground select transistor 460 in the page 150. The upper ground select transistor 460 may be trimmed by applying a programming voltage, $V_{pgm}$, to the odd ground select line 161. Again, in some embodiments, $V_{pgm}$ is between 10V and 14V. Further, the upper ground select transistors may be trimmed using incremental step pulse programming, much like the string select transistors.

As the ground select lines are shared between multiple upper ground select transistors, precautions should be taken to inhibit the undesired programming of unselected upper grate select transistors. During the trimming of the upper ground select transistor 460, a self-boosting method may be used to inhibit programming of the other upper ground select transistors sharing the odd ground select line 161, such as the upper ground select transistor 462. In the self-boosting method, both the ground select transistors and the string select transistors of the unselected even pages (e.g., the page 152) are switched off, which leaves the channels of the unselected upper ground select transistors within these pages (as well as their respective NAND strings) floating. When $V_{pgm}$ is applied to the even ground select line 161, these channels are boosted due to capacitive coupling. The boosting effect can be further increased by concurrently applying $V_{pass}$ to the word lines 120, 121, 120n, as these lines may also be capacitively coupled to the channels of the unselected upper ground select transistors through their respective NAND strings. This effectively and efficiently prevents the upper ground select transistor 462 from being significantly affected by $V_{pgm}$ when the upper ground select transistor 460 is trimmed.

As mentioned above, the upper ground select transistors on even pages (e.g., the upper ground select transistors 460 and 462) share the odd ground select line 161 with the ground select transistors on odd pages (e.g., the ground select transistors 464 and 466). Accordingly, precautions should be taken to inhibit programming the ground select transistors 464 and 466 when the upper ground select transistor 460 is trimmed. As the odd ground select line 161 is directly adjacent to the common source line 171, the channels associated with the ground select transistors 464 and 466 cannot be disconnected from the common source line 171. Accordingly, the self-boosting method cannot be used for these transistors. Instead, the common source line 171 may be raised to a power supply voltage, $V_{dd}$. This lowers the voltage differential between the gate and channel of the ground select transistors 464 and 466, during the time when the odd ground select line 161 is raised for trimming the upper ground select transistor 460. Accordingly, the ground select transistors 464 and 466 may not be excessively affected during this trimming operation. However, some program disturb may still occur, but this can be compensated for during the ground select transistor trimming operation, which is discussed in relation to FIG. 5.

Referring back to FIG. 4, the upper ground select transistors on a plurality of pages (e.g., every page) may be trimmed during the upper ground select transistor trimming action. In some embodiments, a plurality of upper ground select transistors on a selected page (e.g., those on different layers but vertically aligned) may be trimmed sequentially. Here, when an upper ground select transistor on a selected layer and page is trimmed, the raised bit line method may be used to inhibit programming of other upper ground select transistors on the selected page but on unselected layers (e.g., above and below the selected transistor). Each layer may be iterated through until each of the upper ground select transistors on the selected page are trimmed. In other embodiments, the upper ground select transistors on a selected page may be trimmed in parallel with one another.

After each of the upper ground select transistors on a page is trimmed, the process may be repeated for the next page. A similar technique may be used for the odd pages. When programming odd pages, the odd ground select line may be set to $V_{SSL}$ and the even ground select line may be set to $V_{pgm}$. In some embodiments, the upper ground select transistor trimming action is alternately applied to even and odd pages. In another embodiment, the action is applied to a set of even pages before being applied to a set of odd pages. In yet another embodiment, the action is applied to a set of odd pages before being applied to a set of even pages. Other ordering schemes for applying the action to multiple even and odd pages are contemplated.

As mentioned above, the upper ground select transistor trimming action may occur after the string select transistor trimming action. This trimming order is highly beneficial, due in part to a phenomenon known as the back-pattern effect. Essentially, closed loop $V_t$ programming techniques are most effective when the $V_t$ conditions of all transistors between the transistors selected for programming and the sense circuitry are already set. If the string select transistors were trimmed after the upper ground select transistors, the effective threshold voltages of the upper ground select transistors would be changed, due to a change in resistance between the upper ground select transistors and the sense circuitry. By programming the upper ground select transistors after the string select transistors, the disclosed methods provide a greater level of controllability, which leads to a tighter distribution of the effective values of $V_t$ in each upper ground select transistor.

Figure 5:
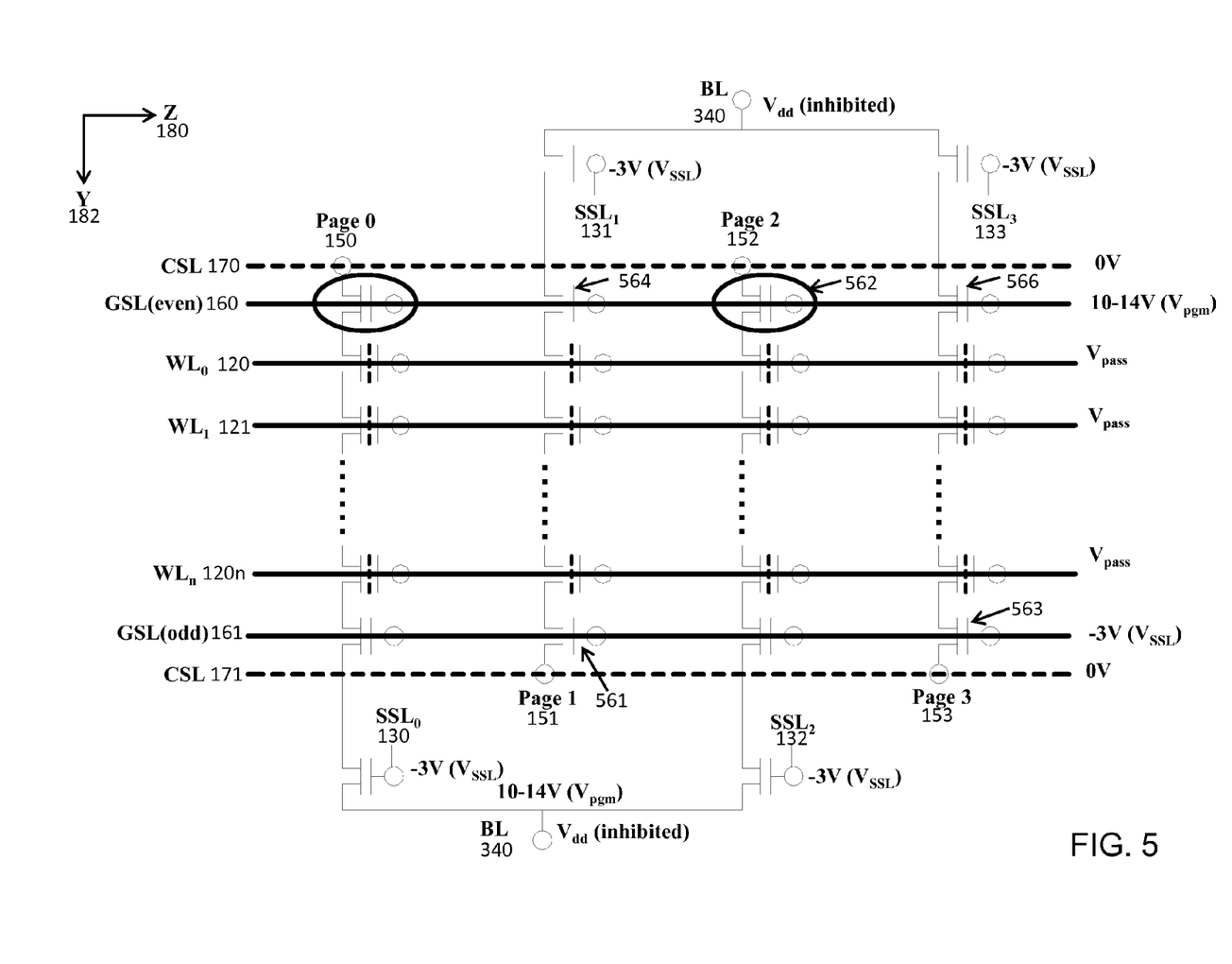
FIG. 5 shows a schematic view illustrating a ground select transistor trimming action.

FIG. 5 shows a schematic view illustrating a ground select transistor trimming action. As shown in the figure, this action may be applied to the plane shown in both FIGS. 3 and 4, and it may follow the upper ground select transistor trimming action. As previously discussed, the trimming of the upper ground select transistors may lead to program disturb on the ground select transistors. These effects may be accounted for during the ground select transistor trimming action.

FIG. 5 specifically shows the trimming of the ground select transistors 560 and 562 in the pages 150 and 152, respectively. Because the ground select transistors 560 and 562 are both directly adjacent to the common source lines 170, it is not possible to disconnect either of them from the common source lines 170. Therefore, it is difficult to program either ground select transistor 560 or 562 in isolation of the other, or in isolation of the other ground select transistors on even pages sharing the common source line 170. Accordingly, these transistors may be programmed using an open loop technique. In some embodiments, the technique may not even require verification after programming. This type of programming may not necessarily tighten the distribution, but it does allow for the center of the $V_t$ distribution to shift nearer to a desired value.

When the ground select transistor trimming action is applied to the ground select transistors 560 and 562, the common source line 170 may be set to 0V, and the bit line 340 may be disconnected from the NAND strings by switching off the associated string select transistors, using $V_{SSL}$ which in some embodiments is −3V. The odd ground select line 161 may also be set to $V_{SSL}$. This allows the channels of the ground select transistors 560 and 562 to be set at 0 V. $V_{pgm}$ may be applied to the even ground select line 160 to provide a voltage differential sufficient to trim $V_t$ of the selected transistors. Again, in some embodiments, $V_{pgm}$ is between 10V to 14V.

It should be noted that the even ground select transistors 560 and 562 share the even ground select line 160 with the upper ground select transistors 564 and 566, which are on the odd pages 151 and 153, respectively. A self-boosting method may be used to inhibit programming of the upper ground select transistors 564 and 566. This self-boosting method may be similar to the method used when programming the upper ground select transistors. However, in this case, the ground select transistors on even pages within the plane (e.g., the ground select transistors 560 and 562) are programmed together, and the NAND strings on the odd pages within the plane are left floating. Accordingly, when $V_{pgm}$ is applied to the even ground select line 160, the channels of the NAND strings on odd pages 151 and 153 are boosted due to capacitive coupling. This leads to the ground select transistors 560 and 562 being programmed together, while the upper ground select transistors 564 and 566 are largely unaffected.

The ground select transistor trimming action may also be applied to the odd pages. When trimming the ground select transistors on the odd pages, the odd ground select line 161 may be set to $V_{pgm}$ and the even ground select line 160 may be set to $V_{SSL}$. This would allow the ground select transistors on odd pages 151 and 153 to be programmed simultaneously, and the channels of the NAND strings on the even pages 150 and 152 may be self-boosted during this time.

As the ground select transistor trimming action may involve open loop programming, the $V_t$ distribution of the ground select transistors is not necessarily narrowed. However, this distribution can be pushed leftward (e.g., decreasing the average value of V) or rightward (e.g., increasing the average value of V), depending on what would be most beneficial for normal array operation. In some embodiments, a calculation of this shift takes the expected amount of program disturb from the upper ground select transistor trimming action into account.

Figure 6:
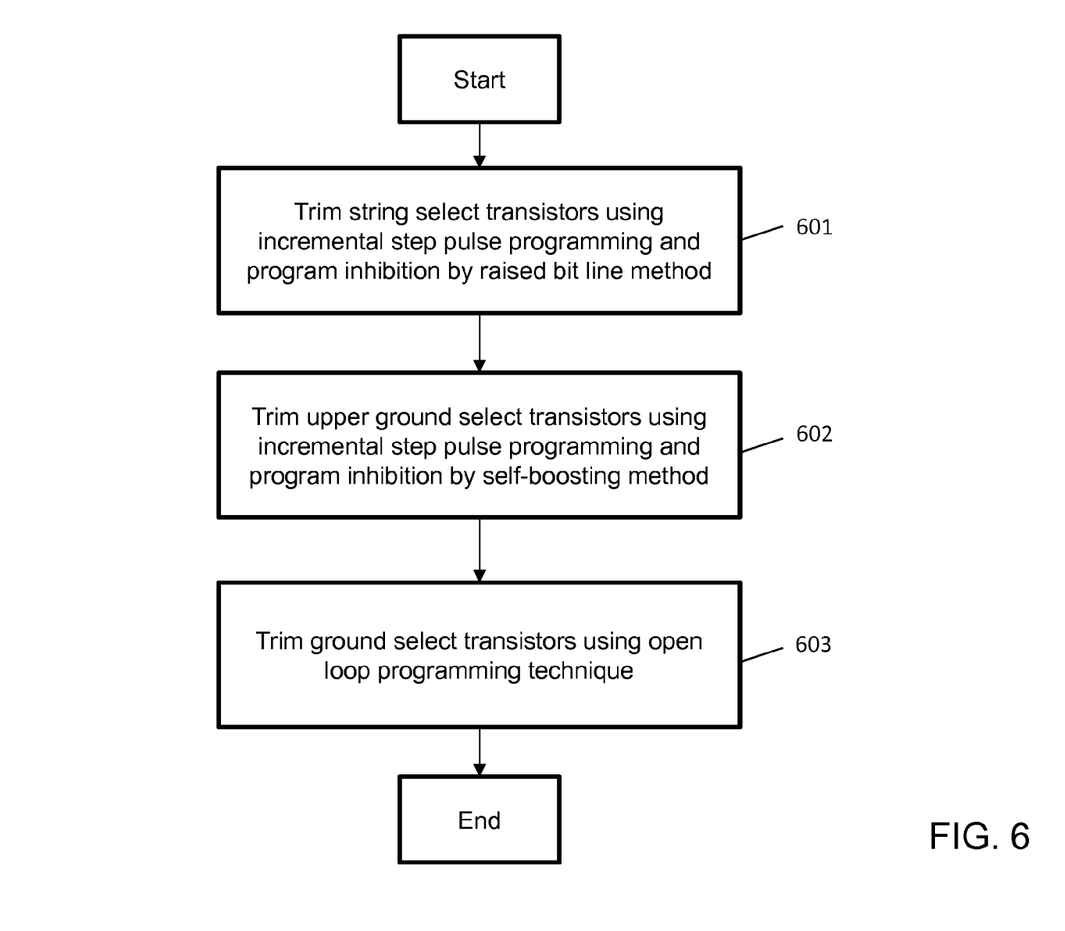
FIG. 6 shows a block diagram of a trimming process, in accordance with the disclosed principles.

FIG. 6 shows a block diagram of a trimming process, which may precede standard array operations. In this context, standard array operations may include reading, writing, and erasing the memory cells within the array. The process may begin with a string select transistor trimming action 601, wherein the string select transistors attached to the string select line may be trimmed using incremental step pulse programming. During this action 601, a raised bit line method may be used to minimize the impact on unselected string select transistors that may have already been trimmed. The action 601 may further be performed in accordance with the description accompanying FIG. 3.

The string select transistor trimming action 601 may be followed by an upper ground select transistor trimming action 602. During the action 602, the upper ground select transistors may be trimmed, also using incremental step pulse programming. A self-boosting method may be used to minimize the impact on unselected upper ground select transistors that may have already been trimmed. However, the trimming operations performed during the action 602 may disturb the ground select transistors. The action 602 may further be performed in accordance with the description accompanying FIG. 4.

The action 602 may be followed by a ground select transistor trimming action 603. During the action 603, the ground select transistors may be trimmed. The trimming may involve an open loop programming technique, due to the difficulty in separating the ground select transistors from the common source line. During this time, the self-boosting method may be used to inhibited programming the upper ground select transistors, which may already be trimmed during the upper ground select transistor trimming action 602 and before the ground select transistor trimming action 603 begins. Further, the action 603 may account for the program disturb to the ground select transistors caused by the upper ground select transistor trimming action 602. The ground select transistor trimming action 603 may further be performed in accordance with the description following FIG. 5.

In some embodiments, a given action (e.g., the string select transistor trimming action 601), may be applied to each of the logical blocks across a memory device (e.g., at a device-wide level) before the next action is applied. In other embodiments, the actions may be applied within one or more logical blocks within a memory device before the actions are repeated for other logical blocks within the memory device. In some embodiments, the order of the actions 601, 602, and 603 is changed (e.g., the upper ground select transistor trimming action 602 may be performed after the ground select trimming transistor action 603).

Through the trimming operations of the actions 601, 602, and 603, the $V_t$ distributions of the string select transistors, upper ground select transistors, and ground select transistors may all be modified, allowing for better performance during the standard array operations.

Figure 7A:
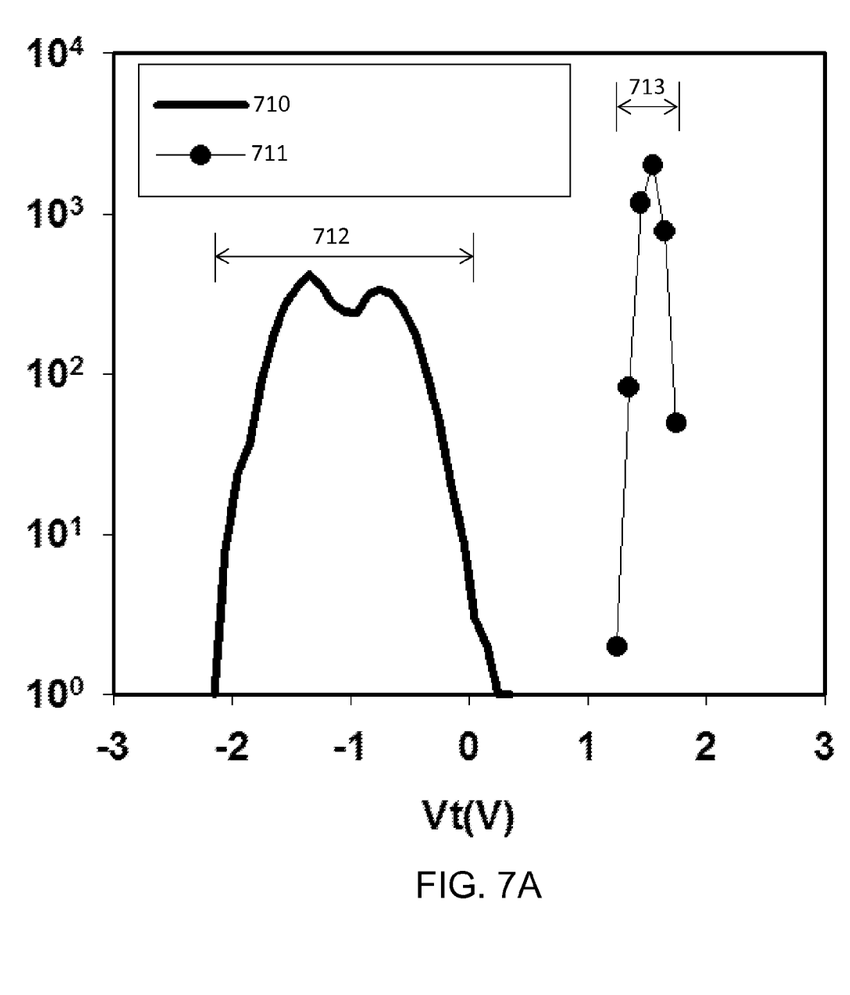
FIGS. 7A-7C show graphs illustrating test results after performing various actions of a trimming process, in accordance with the disclosed principles.
Figure 7B:
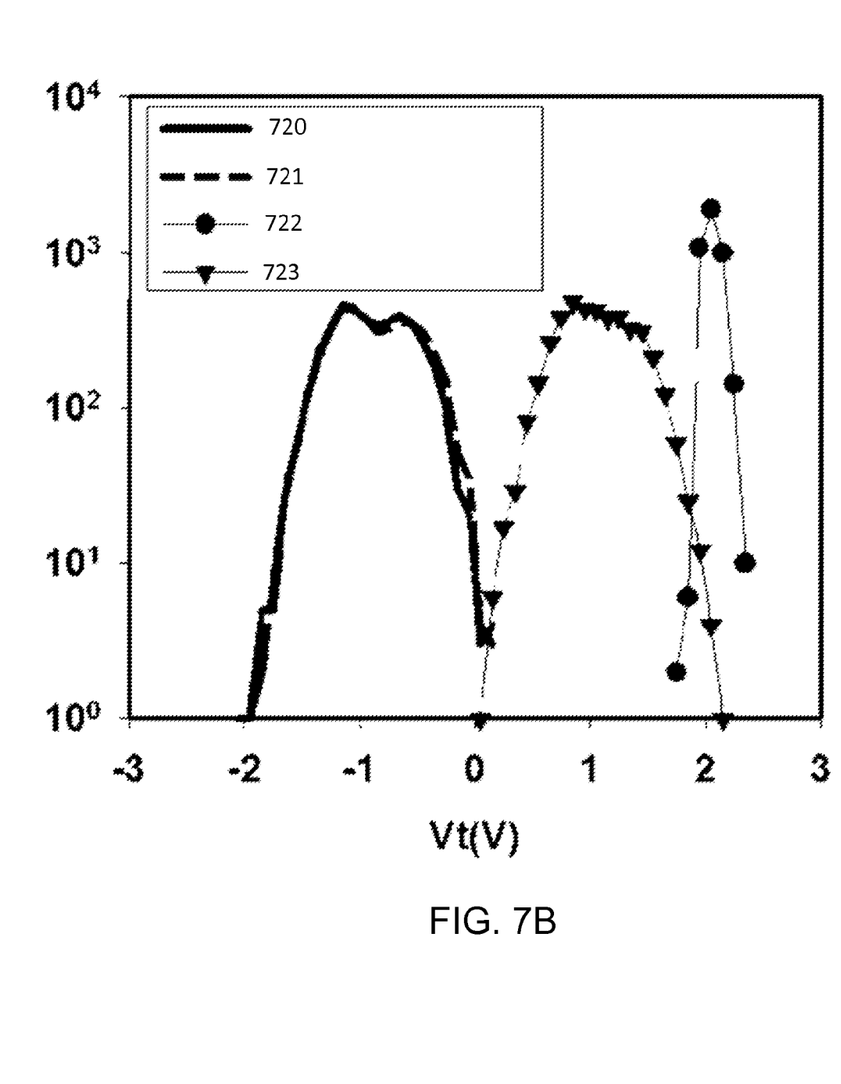
Figure 7C:
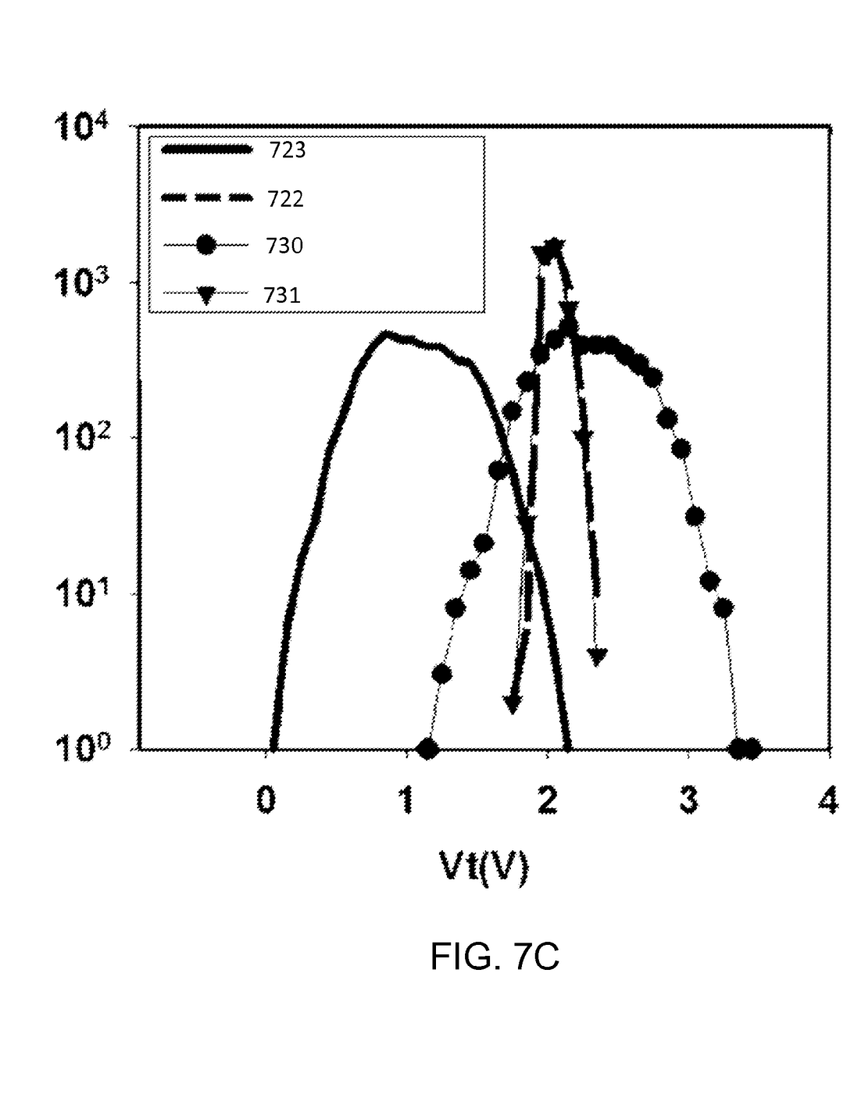

FIGS. 7A-7C show graphs illustrating test results after performing a trimming process in accordance with the disclosed principles. FIG. 7A shows a graph illustrating the results of the string select transistors trimming action. The horizontal axis measures $V_t$ in volts and the vertical axis measures the number of occurrences within each $V_t$ value range on a logarithmic scale. A data set 710 represents the $V_t$ distribution of string select transistors in a device before the string select transistor action is performed. A data set 711 represents the $V_t$ distribution of these same string select transistors after this action is performed, wherein these transistors are trimmed. The width 713 of the data set 711 is shown to be smaller than the width 712 of the data set 710. This illustrates that each of the trimmed string select transistors generally have a more predictable and well-controlled $V_t$. Further, the $V_t$ distribution is shifted to the right of 0V, which ensures that the trimmed string select transistors generally do not conduct when 0V is applied. In general, the rightward shift in $V_t$ indicates that the trimmed string select transistors are generally less likely to unintentionally conduct at an "off" voltage (e.g., $V_{SSL}=-3V$), leading to less leakage current on the bit lines. Less leakage current is highly desirable, because it allows for faster read times and greater power efficiency, among other benefits.

FIG. 7B shows a graph illustrating the results of the upper ground select transistor trimming action. The horizontal axis measures $V_t$ in volts and the vertical axis measures the number of occurrences within each $V_t$ value range on a logarithmic scale. A data set 720 represents the $V_t$ distribution of the upper ground select transistors in a device before the upper ground select transistor trimming action is performed, and a data set 722 represents the $V_t$ distribution of these same transistors after the action is performed. The figure shows that the trimming performed during this action leads to a narrower and rightward shifted $V_t$ distribution for the upper ground select transistors. It should be noted that these results are very similar to those shown in FIG. 7A with respect to the string select transistors, and the trimming operation of the upper ground select transistors helps to provide many of the same benefits listed above.

FIG. 7B additionally shows a data set 721 which represents the $V_t$ distribution of the ground select transistors in a device before the upper ground select transistor trimming operation is performed, and a data set 723 which represents the $V_t$ distribution of these same ground select transistors after the upper ground select transistors are trimmed. As previously discussed, the ground select transistors may be disturbed during the trimming of the upper ground select transistors. The net effect of this program disturb is shown by the rightward shift from the data set 721 representing $V_t$ values before the trimming operation to the data set 723 representing $V_t$ values after the trimming operation.

FIG. 7C shows a graph illustrating the results of the ground select transistor trimming action. The horizontal axis measures $V_t$ in volts and the vertical axis measures the number of occurrences within each $V_t$ value range on a logarithmic scale. The graph re-illustrates the data sets 722 and 723 from the previous graph, as these may be the $V_t$ distributions of the upper ground select transistors and ground select transistors, respectively, before the ground select transistor trimming action begins. A data set 730 represents the $V_t$ distribution of the ground select transistors after the action is performed. As this is an open loop method, the $V_t$ distribution is not narrowed, but it is shifted to the right, thereby increasing the average $V_t$ of the ground select transistors. This effectively decreases leakage between the NAND strings and the common source line. A data set 731 represents the $V_t$ distribution of the upper ground select transistors after the ground select transistor trimming action is performed. As indicated by the data set 731 overlapping with the data set 722, the upper ground select transistors are not significantly affected by the ground select transistor trimming action, and this is due, in part, to the self-boosting method's effectiveness.

The array and surrounding structures may be implemented in an integrated circuit. The integrated circuit may also include a controller, which may be connected to the word lines, string select lines, bit lines, and other lines associated with the array. Through these connections and by utilizing sense circuitry, the controller may coordinate the trimming operations of the string select transistors, the upper ground select transistors, and the ground select transistors. The controller may also coordinate standard array operations including the read, write, and programming operations. The controller may be implemented as a general purpose processor, which executes a computer program to perform the trimming operations and/or the standard array operations. The computer program may be stored in non-transitory memory accessible by the processor. In other embodiments, the controller may be implemented through special purpose application circuitry, or a combination of modules providing system-on-a-chip functionality supported by the memory array, as is known in the art. In yet other embodiments, the controller may be implemented through a combination of special-purpose logic circuitry and a general-purpose processor. Further, the controller may implement or utilize a finite state machine to perform the trimming operations and/or the standard array operations.

The term "trimming" refers to adjusting the $V_t$ or otherwise affecting the state of one or more selected transistors. In some scenarios, the $V_t$ and/or state of a trimmed transistor may remain unchanged. Further, "trimming" may be performed using open loop techniques or close loop techniques, depending on the context.

It is to be understood that the principles described herein can be applied outside the context of NAND Flash memory devices described in the exemplary embodiments, including NOR Flash memory devices, one-time programmable (OTP) memory devices, other anti-fuse-based memory devices, floating gate memory devices, charge trapping memory devices, nonvolatile memory devices, embedded memory devices, and/or other memory devices.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Various terms used in the present disclosure have special meanings within the present technical field. Whether a particular term should be construed as such a "term of art" depends on the context in which that term is used. "Connected to," "in communication with," "associated with," or other similar terms should generally be construed broadly to include situations both where communications and connections are direct between referenced elements or through one or more intermediaries between the referenced elements. These and other terms are to be construed in light of the context in which they are used in the present disclosure and as one of ordinary skill in the art would understand those terms in the disclosed context. The above definitions are not exclusive of other meanings that might be imparted to those terms based on the disclosed context.

Words of comparison, measurement, and timing such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A system for controlling a memory array comprising a first string of memory cells and a second string of memory cells, the system comprising:
   a group of control transistors for controlling the first and second strings of memory cells, the group of control transistors comprising:
   a first string select transistor, a first upper ground select transistor, and a first ground select transistor, each operably connected to the first string of memory cells; and
   a second string select transistor, a second upper ground select transistor, and a second ground select transistor, each operably connected to the second string of memory cells,
   wherein the first string select transistor is operable to connect the first string of memory cells to a bit line; and
   wherein the second string select transistor is operable to connect the second string of memory cells to the bit line; and
   a controller operable to trim the first and second string select transistors, the first and second upper ground select transistors, and the first and second ground select transistors, thereby changing the threshold voltages of the control transistors that are trimmed,
   wherein the controller is further operable to inhibit programming of the second upper ground select transistor during a time when the first upper ground select transistor is trimmed.

2. The system of claim 1, wherein the controller is further operable to inhibit programming of the second upper ground select transistor by switching off the second string select transistor, thereby disconnecting the second string of memory cells and the second upper ground select transistor from the bit line.

3. The system of claim 1, wherein the controller is further operable to inhibit programming of a third string select transistor sharing a page with the first string select transistor during a time when the first string select transistor is trimmed.

4. The system of claim 3, wherein the controller is further operable to inhibit programming of the third string select transistor by applying a first voltage to a channel of the third string select transistor that is greater than a second voltage applied to a channel of the first string select transistor during the time when the first string select transistor is trimmed.

5. The system of claim 1, wherein the controller is further operable to trim the first and second ground select transistors substantially simultaneously using an open-loop programming technique.

6. The system of claim 1, wherein the controller is further operable to trim the first and second upper ground select transistors after the first and second string select transistors have been trimmed.

7. The system of claim 1, wherein the controller is further operable to trim the first and second ground select transistors after the first and second upper ground select transistors have been trimmed.

8. The system of claim 1, wherein the controller is further operable to trim at least one transistor selected from the group consisting of the first and second string select transistors and the first and second upper ground select transistors using incremental step pulse programming.

9. The system of claim 1, wherein at least one of the first and second string select transistors, the first and second upper ground select transistors, and the first and second ground select transistors comprises at least one charge trapping structure.

10. The system of claim 9, wherein the at least one charge trapping structure comprises an oxide-nitride-oxide layer.

11. A method of trimming control transistors for a memory array, the memory array comprising a first string of memory cells operably connected to a first string select transistor, a first upper ground select transistor, and a first ground select transistor, the first string select transistor operable to connect the first string of memory cells to a bit line, and the memory array further comprising a second string of memory cells operably connected to a second string select transistor, a second upper ground select transistor, and a second ground select transistor, the second string select transistor operable to connect the second string of memory cells to the bit line, and the method comprising:
   trimming the first string select transistor;
   trimming the second string select transistor;
   trimming the first upper ground select transistor;
   trimming the second upper ground select transistor;
   trimming the first ground select transistor;
   trimming the second ground select transistor; and inhibiting programming of the second upper ground select transistor during the trimming of the first upper ground select transistor, wherein the trimming of each transistor changes the threshold voltages of the respective transistor.

12. The method of claim 11, further comprising:

inhibiting programming of the second upper ground select transistor by switching off the second string select transistor, thereby disconnecting the second string of memory cells from the bit line.

13. The method of claim 11, further comprising:

inhibiting programming of a third string select transistor sharing a page with the first string select transistor during the trimming of the first string select transistor.

14. The method of claim 13, wherein the inhibiting of the programming of the third string select transistor comprises applying a first voltage to a channel of the third string select transistor that is greater than a second voltage applied to a channel of the first string select transistor during the trimming of the first string select transistor.

15. The method of claim 11, wherein the trimming of the first ground select transistor is performed substantially simultaneously with the trimming of the second ground select transistor using an open-loop programming technique.

16. The method of claim 11, wherein the trimming of the first upper ground select transistor and the trimming of the second upper ground select transistor are both performed after both the trimming of the first string select transistor and the trimming of the second string select transistor.

17. The method of claim 11, wherein the trimming of the first ground select transistor and the trimming of the second ground select transistor are both performed after both the trimming of the first upper ground select transistor and the trimming of the second upper ground select transistor.

18. The method of claim 11, wherein at least one transistor selected from the group consisting of the first and second string select transistors and the first and second upper ground select transistors is trimmed using incremental step pulse programming.

19. The method of claim 11, wherein at least one of the first and second string select transistors, the first and second upper ground select transistors, and the first and second ground select transistors comprises at least one charge trapping structure.

20. The method of claim 19, wherein the at least one charge trapping structure comprises an oxide-nitride-oxide layer.

* * * * *